US009681541B2

United States Patent
Higashida et al.

(10) Patent No.: US 9,681,541 B2
(45) Date of Patent: Jun. 13, 2017

(54) RESIN COMPOSITION, PREPREG, METAL FOIL WITH RESIN, METAL-CLAD LAMINATED PLATE, AND PRINTED WIRING BOARD

(71) Applicant: Panasonic Intellectual Property Management Co., Ltd., Osaka (JP)

(72) Inventors: Toshiyuki Higashida, Fukushima (JP); Hidetsugu Motobe, Fukushima (JP); Daisuke Nii, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/130,943

(22) Filed: Apr. 16, 2016

(65) Prior Publication Data

US 2016/0234934 A1 Aug. 11, 2016

Related U.S. Application Data

(63) Continuation of application No. PCT/JP2015/005225, filed on Oct. 16, 2015.

(30) Foreign Application Priority Data

Oct. 22, 2014 (JP) .................................. 2014-215672

(51) Int. Cl.
*H05K 1/02* (2006.01)
*H05K 1/03* (2006.01)
(Continued)

(52) U.S. Cl.
CPC .............. *H05K 1/0353* (2013.01); *B32B 5/02* (2013.01); *B32B 15/082* (2013.01); *B32B 15/14* (2013.01);
(Continued)

(58) Field of Classification Search
CPC .... H05K 1/0353; B32B 15/082; B32B 15/14; B32B 15/20; B32B 27/18; B32B 5/02
(Continued)

(56) References Cited

U.S. PATENT DOCUMENTS

2010/0068958 A1 3/2010 Carson et al.
2012/0263955 A1* 10/2012 Chen ...................... C08L 63/00
428/416

FOREIGN PATENT DOCUMENTS

JP 2-127415 5/1990
JP 9-025349 1/1997
(Continued)

OTHER PUBLICATIONS

International Search Report of PCT application No. PCT/JP2015/005225 dated Jan. 12, 2016.

*Primary Examiner* — Tremesha S Willis
(74) *Attorney, Agent, or Firm* — McDermott Will & Emery LLP (57) ABSTRACT

Resin composition of the present disclosure includes: an epoxy resin; and a hardener, in which the hardener contains a styrene-maleic anhydride copolymer (SMA) and an anhydride having only one anhydride group in a molecule. An acid value of the SMA is in a range from 300 to 550, inclusive. A ratio of an anhydride equivalent number of the anhydride with respect to an epoxy group equivalent number of the epoxy resin is in a range from 0.05 to 0.5, inclusive. A ratio of the total number of the equivalent numbers of the anhydride groups of the anhydride and the SMA with respect to the epoxy group equivalent number is a range from 0.5 to 1.2, inclusive.

7 Claims, 2 Drawing Sheets

(51) Int. Cl.
    *C08J 5/24*      (2006.01)
    *C08G 59/40*     (2006.01)
    *C08K 5/09*      (2006.01)
    *C08L 25/08*     (2006.01)
    *C08L 63/00*     (2006.01)
    *C08G 59/42*     (2006.01)
    *C08L 63/08*     (2006.01)
    *B32B 5/02*      (2006.01)
    *B32B 15/082*    (2006.01)
    *B32B 15/14*     (2006.01)
    *B32B 15/20*     (2006.01)
    *B32B 27/18*     (2006.01)
    *B32B 27/20*     (2006.01)
    *B32B 27/30*     (2006.01)
    *B32B 15/092*    (2006.01)

(52) U.S. Cl.
    CPC ............. *B32B 15/20* (2013.01); *B32B 27/18* (2013.01); *B32B 27/20* (2013.01); *B32B 27/302* (2013.01); *C08G 59/40* (2013.01); *C08G 59/4261* (2013.01); *C08G 59/4284* (2013.01); *C08J 5/24* (2013.01); *C08K 5/09* (2013.01); *C08L 25/08* (2013.01); *C08L 63/00* (2013.01); *C08L 63/08* (2013.01); *H05K 1/0296* (2013.01); *H05K 1/03* (2013.01); *B32B 15/092* (2013.01); *B32B 2260/021* (2013.01); *B32B 2260/046* (2013.01); *B32B 2262/101* (2013.01); *B32B 2264/102* (2013.01); *B32B 2270/00* (2013.01); *B32B 2307/20* (2013.01); *B32B 2307/206* (2013.01); *B32B 2307/30* (2013.01); *B32B 2307/306* (2013.01); *B32B 2307/3065* (2013.01); *B32B 2307/50* (2013.01); *B32B 2457/08* (2013.01); *C08J 2363/08* (2013.01); *C08J 2435/06* (2013.01); *C08L 2203/206* (2013.01); *H05K 2201/012* (2013.01)

(58) Field of Classification Search
    USPC .......................................... 174/250, 255–259
    See application file for complete search history.

(56) References Cited

FOREIGN PATENT DOCUMENTS

| | | |
|---|---|---|
| JP | 9-194610 | 7/1997 |
| JP | 2009-001787 | 1/2009 |
| JP | 2009-073871 | 4/2009 |
| JP | 2010-506999 | 3/2010 |
| JP | 2010-229221 | 10/2010 |
| JP | 2011-124075 | 6/2011 |
| JP | 2015-168744 | 9/2015 |
| WO | 2015/001764 | 1/2015 |

* cited by examiner

RESIN COMPOSITION, PREPREG, METAL FOIL WITH RESIN, METAL-CLAD LAMINATED PLATE, AND PRINTED WIRING BOARD

BACKGROUND

1. Technical Field

The present disclosure relates to a resin composition used as a material of a printed wiring board, a prepreg, a metal-clad laminated plate, a metal foil with resin, and a printed wiring board.

2. Description of the Related Art

In the related art, a technology of improving heat resistance by improving a glass transition temperature (Tg) or the like of a printed wiring board used in an electronic device has been achieved. Flame retardant properties of a printed wiring board have also been achieved. In recent years, particularly in the field of small-sized electronic devices such as mobile devices, it is required to further reduce a dielectric constant and a coefficient of thermal expansion (CTE) of a printed wiring board in the market, in order to realize a small size, a thin thickness, and multi functions of a device. In general, a resin composition containing an epoxy resin is used as an insulating material of a printed wiring board. In this resin composition, a phenol-based hardener, a diamine-based hardener, a cyanate-based hardener, an anhydride-based hardener, and the like are used as a hardener of the epoxy resin. Among these hardeners, it is known that the anhydride-based hardener is effective, in order to reduce a dielectric constant. As the anhydride-based hardener used in the related art, an anhydride-based compound having a plurality of anhydride rings in one molecule or a styrene-maleic anhydride copolymer is used. The styrene-maleic anhydride copolymer can be expressed as a styrene-maleic anhydride copolymer. In addition, the styrene-maleic anhydride copolymer is also abbreviated as SMA. For example, Japanese Patent Unexamined Publication No. 9-194610 discloses a technology of using a copolymer having styrene and a maleic anhydride as compulsory components, as the anhydride-based hardener. This copolymer is the same as SMA.

SUMMARY

The present disclosure provides a resin composition which can reduce a dielectric constant and increase the peel strength, a prepreg, a metal foil with resin, a metal-clad laminated plate, and a printed wiring board.

A resin composition according to the present disclosure includes: an epoxy resin; and a hardener, in which the hardener contains a styrene-maleic anhydride copolymer and an anhydride having only one anhydride group in a molecule. An acid value of the styrene-maleic anhydride copolymer is from 300 to 550, inclusive. A ratio of an anhydride group equivalent number of the anhydride with respect to an epoxy group equivalent number of the epoxy resin is from 0.05 to 0.5, inclusive. And a ratio of the total number of an anhydride group equivalent number of the anhydride and an anhydride group equivalent number of the styrene-maleic anhydride copolymer with respect to the epoxy group equivalent number is from 0.5 to 1.2, inclusive.

According to the present disclosure, it is possible to decrease a dielectric constant and improve the peel strength by using the anhydride and the styrene-maleic anhydride copolymer having a predetermined acid value at a predetermined ratio of the equivalent number, as components of the hardener.

DETAILED DESCRIPTION OF PREFERRED EMBODIMENTS

Before the description of the exemplary embodiments of the present disclosure, problems of a printed wiring board using an epoxy resin of the related art will be described.

In a case where an anhydride having a plurality of anhydride groups is used as a hardener of an epoxy resin, a dielectric constant cannot be sufficiently decreased according to a required level in the market. Adhesive strength such as peel strength is not sufficient either. An SMA is effective in order to reduce a dielectric constant, compared to the anhydride having a plurality of anhydride groups. Meanwhile, in a case of using the SMA, the peel strength is low.

The inventors of this specification have repeated investigations for solving the above-mentioned problems of the styrene-maleic anhydride copolymer (SMA). As a result, the inventors have found that an anhydride is effective for compensating defects of the SMA. That is, the inventors have found that it is particularly effective to use the SMA and the anhydride in combination. In addition, the inventors have also found that an acid value of the SMA or a number of equivalents of the SMA and the anhydride significantly affects a dielectric constant and peel strength. Therefore, the inventors of this specification have performed further investigations to complete the present disclosure.

Hereinafter, the exemplary embodiments of the present disclosure will be described.

A resin composition according to an exemplary embodiment of the present disclosure contains an epoxy resin and a hardener.

The epoxy resin is not particularly limited as long as the epoxy resin contains two or more epoxy groups. Examples thereof include a dicyclopentadiene type epoxy resin, a phosphorus-containing epoxy resin, a naphthalene type epoxy resin, a bisphenol A type epoxy resin, a bisphenol F type epoxy resin, a phenol novolac type epoxy resin, a cresol novolac type epoxy resin, a bisphenol A novolac type epoxy resin, a biphenyl type epoxy resin, an alicyclic epoxy resin, a multi-functional phenol diglycidyl ether compound, and a multi-functional alcohol diglycidyl ether compound. One kind of epoxy resin can be used or two or more kinds of epoxy resins can be used in combination. In particular, in order to reduce a dielectric constant of the resin composition, it is preferable to contain a dicyclopentadiene type epoxy resin as the epoxy resin. In addition, when a phosphorus-containing epoxy resin is used, it is possible to increase a phosphorus content of the resin composition. It is possible to improve flame retardant properties by increasing the phosphorus content.

The resin composition according to the exemplary embodiment contains a styrene-maleic anhydride copolymer (SMA) and an anhydride having only one anhydride group in a molecule, as hardeners.

First, the SMA will be described. The SMA is a binary copolymer (copolymer) generated by polymerization of a styrene monomer and a maleic anhydride and is an anhydride having a plurality of anhydride groups. The SMAs are classified into an alternating copolymer, a random copolymer, a block copolymer, and a graft copolymer according to differences depending on arrays of the styrene monomer and the maleic anhydride. Any of these copolymers may be used. An acid value of the SMA is from 300 to 550, inclusive. This acid value is represented in mg of potassium hydroxide necessary for neutralizing free fatty acid present in 1 g of the SMA. When the acid value is equal to or greater than 300, it is possible to improve the peel strength of a metal-clad laminated plate and a printed wiring board. In addition, the maximum acid value of the SMA is 550. In the SMA, a molar ratio of the styrene monomer and the maleic anhydride is not particularly limited. For example, the molar ratio is from 1:1 to 2:1, inclusive. A weight average molecular weight of the SMA is not particularly limited, either. For example, the weight average molecular weight is from 4500 to 9000, inclusive.

Next, the anhydride of the exemplary embodiment will be described. This anhydride contains only one cyclic anhydride group (—COOCO—) in one molecule. An anhydride such as a dicarboxylic acid compound can be used as the anhydride. More specific examples thereof include a maleic anhydride, a phthalic anhydride, a 4-methylhexahydrophthalic anhydride, a hexahydrophthalic anhydride, a methylbicyclo[2.2.1]heptane-2,3-dicarboxylic anhydride, a bicyclo[2.2.1]heptane-2,3-dicarboxylic anhydride, and a 1,2,3,6-tetrahydrophthalic anhydride. In addition, an anhydride such as a tricarboxylic acid compound is used as the anhydride. More specific examples thereof include trimellitic acid anhydride and the like. Particularly, in order to reduce the dielectric constant, alicyclic anhydrides such as a 4-methylhexahydrophthalic anhydride, a hexahydrophthalic anhydride, a methylbicyclo[2.2.1]heptane-2,3-dicarboxylic anhydride, a bicyclo[2.2.1]-heptane-2,3-dicarboxylic anhydride, and a 1,2,3,6-tetrahydrophthalic anhydride are preferable. In addition, in the exemplary embodiment, an anhydride subjected to preliminary reaction is used, as will be described later. In this preliminary reaction, it is preferable to use an anhydride having a boiling point equal to or lower than 150° C. and preferably equal to or lower than 130° C., in order to effectively prevent volatility. In addition, the anhydride as a hardener has a comparatively small molecular weight, compared to that of the SMA. Accordingly, it is preferable to use an anhydride having a weight average molecular weight equal to or smaller than 400, for example, in order to prevent an increase in varnish viscosity. When such an anhydride is used with the SMA, it is possible to reduce the dielectric constant (Dk) of the hardened product and increase the peel strength. In the resin composition, one kind of anhydride can be used or two or more kinds of anhydrides can be used in combination.

In the exemplary embodiment, a ratio of an anhydride equivalent number of the anhydride with respect to an epoxy equivalent number of the epoxy resin is from 0.05 to 0.5, inclusive. A ratio of the total number of an anhydride equivalent number of the anhydride and an anhydride equivalent number of the styrene-maleic anhydride copolymer with respect to an epoxy equivalent number of the epoxy resin is from 0.5 to 1.2, inclusive. When conditions of this ratio are satisfied, it is possible to reduce the dielectric constant and improve the peel strength. When the ratio of the anhydride equivalent number of the anhydride with respect to the epoxy equivalent number of the epoxy resin is less than 0.05, the content of the anhydride is excessively small and therefore the peel strength may not be sufficiently improved. When the ratio of the anhydride equivalent number of the anhydride with respect to the epoxy equivalent number of the epoxy resin is greater than 0.5, the control of molding conditions when molding a laminated plate may be difficult or the control of a reaction rate of the preliminary reaction which will be described later may be difficult. This may be because that reactivity of the anhydride with respect to the epoxy resin is high. The ratio of the anhydride equivalent number of the anhydride with respect to the epoxy equivalent number of the epoxy resin is more preferably from 0.12 to 0.5, inclusive. In addition, when the ratio of the total number of the anhydride equivalent number of the anhydride and the anhydride equivalent number of the styrene-maleic anhydride copolymer with respect to the epoxy equivalent number is less than 0.5, the dielectric constant may be insufficiently reduced. Meanwhile, when this ratio is greater than 1.2, the peel strength may be insufficient. This is because that the content of the anhydride has an upper limit and as a result, the content of the styrene-maleic anhydride copolymer is increased.

In the resin composition according to the exemplary embodiment, the anhydride and the epoxy resin are preferably used as preliminary reaction products obtained by a preliminary reaction of these components.

In the preliminary reaction products, the epoxy resin and the anhydride are combined with each other so that the ratio of the anhydride equivalent number of the anhydride with respect to the epoxy equivalent number of the epoxy resin is from 0.05 to 0.5 (from 1:0.05 to 1:0.5), inclusive. In a case where this ratio exceeds 0.5, the reactivity of the anhydride is high, and therefore, it is difficult to control the reactivity in the preliminary reaction. A three-dimensional network is easily formed due to the reaction, and therefore, the resin composition is gelated and the manufacturing of a prepreg may be difficult.

In addition, in the preliminary reaction products, it is preferable that the reaction between the epoxy resin and the anhydride is performed so that a ring opening rate of the anhydride is equal to or greater than 80% (upper limit is 100%). This is because a monomer of the anhydride has comparatively high volatility. When a large amount of the anhydride is present as a form of a monomer in the resin composition, some of the monomers are lost due to volatilization in a manufacturing process (for example, a drying process) of the prepreg, and this may cause a fluctuation in a component ratio of the resin composition. With respect to this, it is possible to prevent volatilization of the anhydride by allowing the preliminary reaction so that the ring opening rate of the anhydride is equal to or greater than 80%.

The ring opening rate of the anhydride can be calculated as follows, for example. First, a varnish (primary varnish which will be described later) obtained by at least combining an epoxy resin and an anhydride for the preliminary reaction with each other and dissolving the components in a solvent is prepared. At that time, a hardening accelerator may be combined with the varnish, but other organic components having reactivity with the epoxy resin are not combined therewith. Examples of these organic components include the SMA and a flame retardant having reactivity. Next, infrared absorption spectra before and after heating this varnish are measured. An area (A1) before the heating and an area (A2) after the heating regarding the peak in the vicinity of 1800 cm$^{-1}$ to 1900 cm$^{-1}$ caused by a cyclic anhydride group are measured. At that time, the heating is performed under the heating conditions of the varnish for performing the heating at a temperature of 60° C. to 80° C. for the time of 1 hour to 5 hours. Then, an area (B1) before the heating and an area (B2) after the heating regarding the peak in the vicinity of 1500 cm$^{-1}$ to 1530 cm$^{-1}$ which is an internal standard peak caused by a benzene ring are measured. The ring opening rate of the anhydride can be calculated by substituting the area of each peak acquired as described above in the following equation.

Ring opening rate of anhydride (%)={1·($A_2$/$B_2$)/($A_1$/$B_1$)}×100

In a case where the ring opening rate of the anhydride is less than 80%, a large amount of unreacted anhydrides remains and the anhydrides are easily lost due to volatilization during the manufacturing of the prepreg. The hardener may be insufficient due to volatilization and crosslink density of the hardened product of the resin composition may be decreased. When the crosslink density is decreased, a glass transition temperature of the hardened product may be decreased. The glass transition temperature decreased may cause a deterioration in heat resistance. The ring opening rate of the anhydride changes depending on the heating temperature and the heating time at the time of preparation of the varnish. Therefore, the heating conditions are suitably adjusted so that the ring opening rate is equal to or greater than 80%. When the reaction products are sampled over time to check the ring opening rate while allowing the preliminary reaction in practice, it is possible to suitably set the conditions of the preliminary reaction.

As described above, the resin composition preferably contains the preliminary reaction products obtained by the preliminary reaction between the epoxy resin and the anhydride and the styrene-maleic anhydride copolymer. Since the ratio of the anhydride equivalent number of the anhydride with respect to the epoxy equivalent number of the epoxy resin is from 0.05 to 0.5, inclusive, unreacted epoxy groups are contained in the preliminary reaction products. The entire anhydride may be reacted or a slight amount of unreacted anhydrides may be contained in the preliminary reaction products. Since the ratio of the total number of the anhydride equivalent number of the anhydride and the anhydride equivalent number of the SMA with respect to the epoxy equivalent number of the epoxy resin is from 0.5 to 1.2 (from 1:0.5 to 1:1.2), the resin composition may contain unreacted SMAs.

In addition, the resin composition may contain a flame retardant, a hardening accelerator, and the like.

As the flame retardant, a halogen flame retardant and a non-halogen flame retardant can be used. As the non-halogen flame retardant, a phosphorus-containing flame retardant can be used, for example. In a case of using the phosphorus-containing flame retardant, the phosphorus content of the entire content of the organic components and the phosphorus-containing flame retardant of the resin composition is preferably equal to or greater than 1.0 mass %, in order to obtain excellent flame retardant properties. An upper limit of this phosphorus content is not particularly limited. However, in a case of using the phosphorus-containing flame retardant exceeding the necessary sufficient content, in order to impart the flame retardant properties, electrical characteristics or heat resistance and the like may be decreased. Therefore, the phosphorus content of the entire content of the organic components and the phosphorus-containing flame retardant is preferably equal to or lower than 5.0 mass %, for example. In addition, at least some of the phosphorus-containing flame retardant is preferably a reactive phosphorus-containing flame retardant having a functional group which reacts with an anhydride group or a carboxyl group (—COOH). The anhydride group in this case is provided in the unreacted anhydride and the SMA, for example. In addition, the carboxyl group is formed with the ring opening of the anhydride and the anhydride group of the SMA, when the epoxy resin reacts with the anhydride and the SMA, for example. Therefore, specific examples of the functional group included in the reactive phosphorus-containing flame retardant include a hydroxyl group and an amino group. Since the anhydride and the SMA contain a large amount of oxygen atoms, the anhydride and the SMA tend to cause a decrease in the flame retardant properties of the hardened product. When the reactive phosphorus-containing flame retardant described above is reacted with the anhydride and the SMA, phosphorus atoms are caused to be present near the oxygen atoms, and therefore, it is possible to improve the flame retardant properties. One kind of flame retardant can be used or two or more kinds of flame retardant can be used in combination. A fusion type phosphorus-containing flame retardant and a dispersion type phosphorus-containing flame retardant which do not react with the anhydride and the SMA or a flame retardant which does not include phosphorus may be used, as long as the flame retardant does not deteriorate the effects of the present disclosure. The fusion type phosphorus-containing flame retardant is fused in the resin composition and realizes a homogeneous system. Specific examples thereof include phosphazene and the like. The dispersion type phosphorus-containing flame retardant is dispersed without being fused in the resin composition and realizes a heterogeneous system. Specific examples of the dispersion type phosphorus-containing flame retardant include aluminum phosphine acid which is metal phosphate.

The hardening accelerator is not particularly limited as long as it can accelerate the reaction of the epoxy resin and the hardener. Examples thereof include an imidazole compound such as 2-ethyl-4-methylimidazole (2E4MZ). The content of the hardening accelerator is not particularly limited as long as it does not deteriorate the effects of the present disclosure.

In addition, the resin composition may contain an inorganic filler and the like. For example, silica such as spherical silica and crushed silica or metal hydroxides such as aluminum hydroxide and magnesium hydroxide can be used. The content of the inorganic filler can be suitably determined by considering a balance between a low dielectric constant and a high Tg. Therefore, the content thereof is not particularly limited, as long as it is the content satisfying the balance described above.

The content of the inorganic filler with respect to 100 parts by mass which is a residual content when removing the inorganic filler from the resin composition is preferably from 5 parts by mass to 80 parts by mass. In addition, the content thereof is more preferably from 10 parts by mass to 50 parts by mass. When the content of the inorganic filler is equal to or greater than 5 parts by mass, it is possible to improve the mechanical strength of the hardened resin composition. In addition, it is possible to decrease the CTE. When the content of the inorganic filler is equal to or smaller than 80 parts by mass, it is possible to prevent an effect on the dielectric constant of the inorganic filler and realize a low constant dielectric of the resin composition.

It is preferable that the inorganic filler is subjected to a surface treatment by a silane coupling agent, in advance. Examples of the silane coupling agent include epoxy silane, isocyanate silane, aminosilane, vinyl silane, methacrylic silane, acrylic silane, ureido silane, mercaptosilane, sulfide-silane, and styrylsilane. In a case of using the silane coupling agent, one kind of silane coupling agent can be used or two or more kinds of silane coupling agents can be used in combination. In general, an amount of a polar group generated by a reaction between the epoxy resin and the anhydride hardener is small. However, in a case where the inorganic filler is subjected to the surface treatment as described above, it is possible to strongly couple the inorganic filler and the organic component with each other by the silane coupling agent and improve alkali resistance of a hardened product of the resin composition, even when an amount of the generated polar group is small.

Examples of a method of performing the surface treatment include a direct treatment method and an integral blending method. The direct treatment method is a method of directly performing treatment of an inorganic filler with a silane coupling agent in advance and blending the surface-treated inorganic filler with a base varnish which will be described later. The integral blending method is a method of adding a silane coupling agent to a base varnish with which an inorganic filler is blended. In the direct treatment method, it is possible to more efficiently couple the inorganic filler and the organic component and further improve alkali resistance of the hardened product of the resin composition, compared to the integral blending method.

Particularly, in a case of using the integral blending method, it is preferable that 1 part by mass to 10 parts by mass of the silane coupling agent with respect to 100 parts by mass of the inorganic filler is further contained in the resin composition. When the content of the silane coupling agent is equal to or greater than 1 part by mass, it is possible to further improve alkali resistance of the hardened product of the resin composition. When the content of the silane coupling agent is equal to or smaller than 10 parts by mass, it is possible to prevent a decrease in heat resistance.

The resin composition can be prepared as a resin varnish after the base varnish is prepared as follows. The base varnish is a varnish obtained by blending organic components with each other excluding the inorganic components such as the inorganic filler.

First, a case of preparing a base varnish by allowing a preliminary reaction between the anhydride and the epoxy resin will be described. In this case, first, a varnish (primary varnish) obtained by at least combining an epoxy resin and an anhydride for the preliminary reaction with each other and dissolving the components in a solvent is prepared. At that time, the primary varnish can also be combined with an organic component which does not directly react with the epoxy resin or the anhydride, such as a hardening accelerator or a non-reactive flame retardant. However, other organic components having reactivity with the epoxy resin or the anhydride is not added to the primary varnish and is combined therewith after the preliminary reaction. As an organic component having reactivity, the SMA or a reactive flame retardant is used, for example. As described above, a component which is blended after the preliminary reaction is referred to as a post-blending component. At the time of performing dissolving in a solvent, a solid content (non-solvent component) concentration of the primary varnish is from 60 mass % to 80 mass %. The preliminary reaction proceeds by heating the dissolved product at a temperature of 60° C. to 80° C. for the time of 1 hour to 5 hours while stirring the dissolved product with a disper such as a disperser or the like. Accordingly, a preliminary reaction product obtained by the reaction between the epoxy resin and the anhydride is generated in the primary varnish. Herein, a correlation between the heating temperature and the reaction time which are preliminary reaction conditions and the ring opening rate of the anhydride may be experimentally grasped in advance by performing sampling or the like as described above. By adjusting the preliminary reaction conditions based on the correlation, it is possible to set the ring opening rate of the anhydride of the reaction product to be equal to or greater than 80%. The heating temperature and the heating time are merely examples. As the solvent used in the preparation of the varnish, a solvent not reacting with the epoxy resin or the anhydride can be used. Examples thereof include ethers such as ethylene glycol monomethyl ether, ketones such as acetone or methyl ethyl ketone (MEK), and aromatic hydrocarbons such as benzene or toluene. Meanwhile, a solvent having a hydroxyl group such as an alcohol-based solvent reacts with the anhydride, and therefore, the usage thereof is desirably avoided. The base varnish can be prepared by adding the post-blending components described above to the primary varnish and adding and mixing the solvent, if necessary.

Next, a case of preparing a base varnish without allowing the preliminary reaction between the anhydride and the epoxy resin will be described. In this case, a base varnish can be prepared by at least blending the epoxy resin, the anhydride, and the SMA and dissolving the components in a solvent. At that time, other blending components excluding the inorganic filler, such as a hardening accelerator or a flame retardant, can also be blended therewith. The solid content (non-solvent component) concentration of the base varnish is from 60 mass % to 80 mass %. Then, the base varnish is stirred and mixed at a temperature of 20° C. to 40° C. for the time of 1 hour to 3 hours while stirring the base varnish with a stirrer such as a disper for homogenization. The method of preparing the base varnish is merely an example. The same solvent as described above can be used as the solvent.

In a case of not blending the inorganic component such as the inorganic filler, the base varnish, as it is, can be used in the preparation of the prepreg as a resin varnish, after the stirring and mixing, regardless of the performance of the preliminary reaction. Meanwhile, in a case of blending the inorganic component, a resin varnish can be prepared by blending in the inorganic component with the base varnish, regardless of the performance of the preliminary reaction and stirring and mixing the base varnish at a temperature of 20° C. to 40° C. for the time of 1 hour to 3 hours for homogenization. The inorganic component is the inorganic filler, for example. In a case of blending the inorganic filler, the surface-treated inorganic filler may be blended with the base varnish using the direct treatment method or the inorganic filler and the silane coupling agent may be directly blended with the base varnish using the integral blending method.

Figure 1:
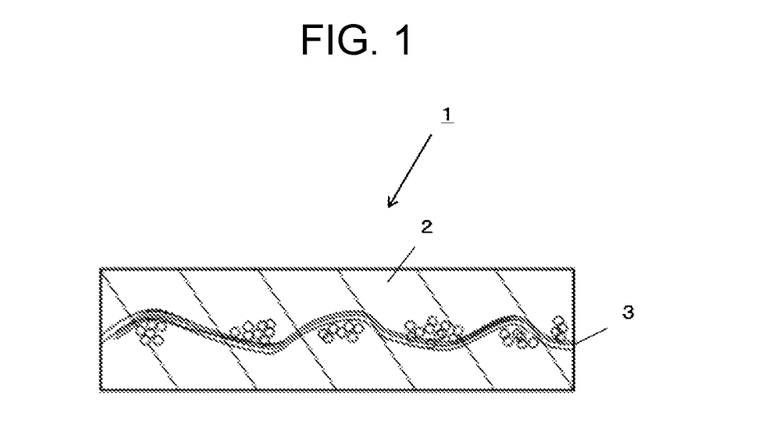
FIG. 1 is a sectional view of a prepreg according to an exemplary embodiment of the present disclosure.

FIG. 1 is a sectional view of prepreg 1 according to the exemplary embodiment of the present disclosure.

Prepreg 1 includes unhardened resin composition 2 and base material 3 impregnated with resin composition 2. That is, prepreg 1 includes unhardened resin composition 2 and the base material containing resin composition 2. The resin composition described above is used as resin composition 2.

In the exemplary embodiment, a base material such as a glass cloth is impregnated with a resin varnish of resin composition 2 obtained as described above. Base material 3 impregnated with the resin varnish is heated at a temperature of 110° C. to 140° C. to be dried. By this drying, the solvent in the resin varnish is removed for semi-hardening of resin composition 2, and accordingly, prepreg 1 can be prepared. At that time, it is preferable that the most of the anhydride is subjected to the preliminary reaction with the epoxy resin in advance and becomes a preliminary reaction product. Accordingly, the anhydride is rarely volatilized even at the time of heating and drying described above and most thereof remains in resin composition 2 which is in a semi-hardened state as the prepreg. In the heating and drying described above, the conditions may be suitably adjusted so that a gelation time of prepreg 1 becomes a desirable time, and the heating and drying is preferably performed so that the gelation time is from 60 seconds to 240 seconds, for example. The gelation time of prepreg 1 means the time from a time point immediately after setting the resin composition in a semi-hardened state extracted from the prepreg on a plate heated to 170° C. to a time point of the gelation of resin composition 2. An amount of resin composition 2 of prepreg 1 is preferably from 30 parts by mass to 80 parts by mass (from 30 mass % to 80 mass %) with respect to 100 parts by mass of the prepreg. A resin amount of prepreg 1 is the content of the resin composition in prepreg 1.

Figure 2:
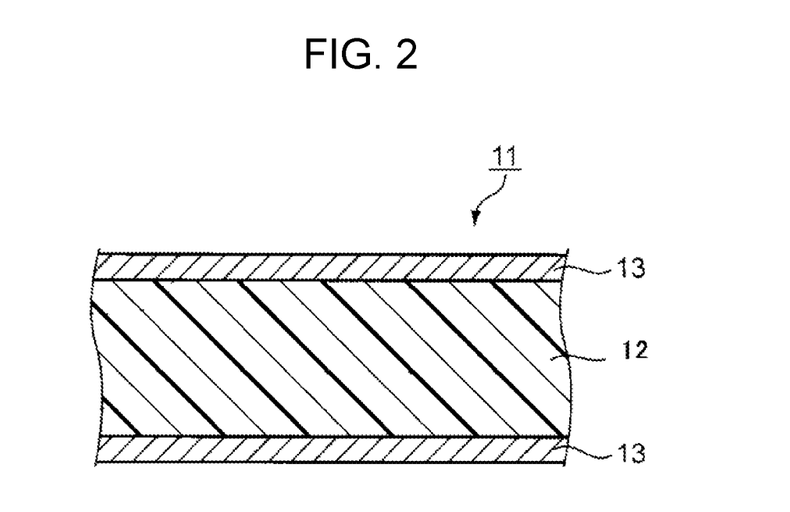
FIG. 2 is a sectional view of a metal-clad laminated plate according to an exemplary embodiment of the present disclosure.

FIG. 2 is a sectional view of metal-clad laminated plate 11 according to the exemplary embodiment of the present disclosure.

Metal-clad laminated plate 11 includes insulating layer 12 containing a hardened product of resin composition 2 and metal layer 13 provided on insulating layer 12. That is, metal-clad laminated plate 11 includes insulating layer 12 containing a hardened product of resin composition 2 and metal layer 13 bonded with insulating layer 12. Herein, the expression "metal layer 13 provided on insulating layer 12" practically means "metal layer 13 provided on a surface of insulating layer 12". Therefore, in metal-clad laminated plate 11, metal layer 13 is not necessarily disposed over insulating layer 12. For example, metal layer 13 may be disposed under insulating layer 12.

In the exemplary embodiment, metal-clad laminated plate 11 can be prepared by molding metal layers 13 and prepreg 1 with heating and pressurizing after laminating metal layers 13 on prepreg 1 manufactured as described above. As the prepreg, a laminate obtained by laminating plurality of prepregs 1 is used, for example. A copper foil is used, for example, as each of metal layers 13. Metal layers 13 are bonded to surfaces positioned on both ends of the laminate of prepreg 1 in a laminating direction. In metal-clad laminated plate 11, the hardened product of prepreg 1 configures insulating layer 12. Prepreg 1 and metal layers 13 are heated and pressurized under the conditions of a temperature of 140° C. to 200° C., inclusive, a pressure of 0.5 MPa to 5.0 MPa, inclusive, and a time of 40 minutes to 240 minutes, inclusive, for example. The cured resin layer configuring this insulating layer 12 is configured with the hardened product of resin composition 2, and therefore the peel strength is improved. In addition, since the anhydride and the SMA are used in combination, it is possible to reduce the dielectric constant of insulating layer 12.

Further, metal-clad laminated plate 11 according to the exemplary embodiment of the present disclosure is manufactured without using prepreg 1. For example, insulating layer 12 is obtained from a varnish-like resin composition, by directly applying the varnish-like resin composition onto the surface of one of metal layers 13 and heating and pressurizing metal layer 13 and the resin composition. The conditions of the heating and pressurizing are the same conditions as those in the method of manufacturing insulating layer 12 from prepreg 1. Metal-clad laminated plate 11 is manufactured by the method described above.

Figure 3:
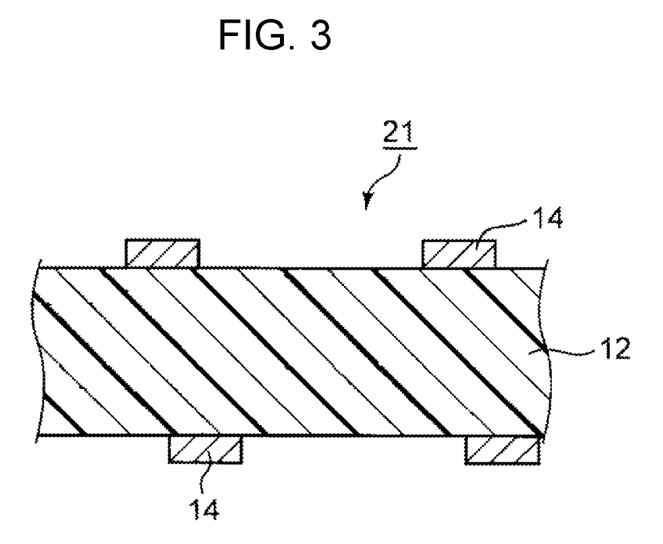
FIG. 3 is a sectional view of a printed wiring board according to an exemplary embodiment of the present disclosure.

FIG. 3 is a sectional view of printed wiring board 21 according to the exemplary embodiment of the present disclosure.

Printed wiring board 21 includes insulating layer 12 containing a hardened product of resin composition 2 and wiring 14 provided on insulating layer 12. That is, printed wiring board 21 includes insulating layer 12 containing the hardened product of resin composition 2 and wiring 14 bonded to insulating layer 12. Herein, the expression "wiring 14 provided on insulating layer 12" practically means "wiring 14 provided on a surface of insulating layer 12". Accordingly, in printed wiring board 21, wiring 14 is not necessarily disposed over insulating layer 12. For example, wiring 14 may be disposed under insulating layer 12.

Printed wiring board 21 can be manufactured by forming a pattern of wiring 14 on metal-clad laminated plate 11. In printed wiring board 21, insulating layer 12 formed of the hardened product of the prepreg is used, for example. For example, printed wiring board 21 can be manufactured by forming a wiring pattern on the surface of metal-clad laminated plate 11 using a subtractive process.

In addition, in a case of using printed wiring board 21 as a core material (inner layer material), a multilayer printed wiring board can be manufactured. The multilayer printed wiring board (not shown) is manufactured by roughening the surface of a conductor pattern (inner layer pattern) of the core material with a black oxidation treatment or the like. After that, the metal layers are laminated on the surfaces of this core material with the prepregs interposed therebetween. The core material on which the metal layer is laminated is molded in a laminated layer shape by heating and pressurizing. At this time, the core material is heated and pressurized under the conditions of a temperature of 140° C. to 200° C., inclusive, a pressure of 0.5 MPa to 5.0 MPa, inclusive, and a time of 40 minutes to 240 minutes, inclusive, for example. Next, drilling and a desmear treatment are performed. After that, a pattern (outer layer pattern) of the wiring is formed from the metal layer using the subtractive process. Through holes are formed by plating on an inner wall of the hole. Through the above processes, the multilayer printed wiring board is manufactured. The number of layers of the printed wiring board is not particularly limited.

In printed wiring board 21, the dielectric constant of insulating layer 12 is decreased. Therefore, when a signal is transmitted by the conductor pattern, it is possible to increase a signal speed and process a large amount of information at a high speed.

Figure 4:
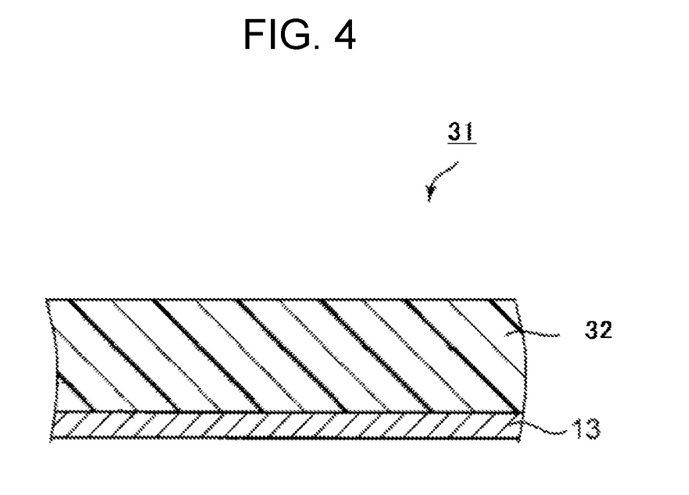
FIG. 4 is a sectional view of a metal foil with resin according to an exemplary embodiment of the present disclosure.

FIG. 4 is a sectional view of metal foil with resin 31 according to the exemplary embodiment of the present disclosure.

Metal foil with resin 31 includes metal layer 13 and insulating layer 32 provided on metal layer 13 and insulating layer 31 contains an unhardened product of resin composition 2. That is, metal foil with resin 31 includes insulating layer 32 containing an unhardened product of resin composition and metal layer 13 bonded to this insulating layer 32. Herein, the expression "insulating layer 32 provided on metal layer 13" practically means "insulating layer 32 provided on a surface of metal layer 13". Therefore, in metal foil with resin 31, insulating layer 32 is not necessarily disposed over metal layer 13. For example, insulating layer 32 may be disposed under metal layer 13.

The printed wiring board manufactured by using metal foil with resin 31 can further reduce a loss at the time of signal transmission in a state where adhesiveness between the wiring and the insulating layer is maintained.

Metal foil with resin 31 is manufactured by applying varnish-like resin composition 2 onto metal layer 13 and performing the heating, for example. The varnish-like thermosetting resin composition is applied onto metal layer 13, for example, by using a bar coater. Applied resin composition 2 is heated under conditions of a temperature of 80° C. to 180° C. for a time of 1 minute to 10 minutes, for example. Heated resin composition 2 is formed on a bonded surface of metal layer 13 as unhardened insulating layer 32.

In addition, printed wiring board 21 can be manufactured by using metal foil with resin 31 as well as metal-clad laminated plate 11. As a method of manufacturing the printed wiring board using metal foil with resin 31, a method of using metal foil with resin 31 by bonding the resin on a resin substrate where a wiring is formed, or a method of using metal foil with resin 31 by laminating the plurality of metal foils with resin is used. At that time, unhardened insulating layer 32 is hardened by the heating. Then, a wiring (not shown) is formed from metal layer 13 by extracting a part of metal layer 13.

EXAMPLES

Hereinafter, the present disclosure will be described in detail with examples.
(Epoxy Resin)
A dicyclopentadiene type epoxy resin is used as the epoxy resin. Specifically, HP-7200H manufactured by DIC Corporation is used. An epoxy equivalent of the epoxy resin is 282 g/eq. A softening point is from 100° C. to 105° C., inclusive.
(Hardener)
"RIKACID MH-700" manufactured by New Japan Chemical Co., Ltd. is used as the anhydride. This anhydride contains a 4-methylhexahydrophthalic anhydride and a hexahydrophthalic anhydride and a blending ratio thereof is 70:30. In addition, this anhydride is a liquid-like alicyclic anhydride. An anhydride equivalent of this anhydride is from 161 g/eq to 166 g/eq. An acid value of this anhydride is 670 KOHmg/g.

As the SMA, "SMA 1000", "SMA 2000", "SMA EF30", and "SMA EF60" manufactured by Cray Valley are used.

A molar ratio of a styrene monomer and a maleic anhydride of "SMA 1000" is 1:1. An acid value of the SMA is 480 KOHmg/g. A weight average molecular weight of the SMA is 5500.

A molar ratio of a styrene monomer and a maleic anhydride of "SMA 2000" is 2:1. An acid value of the SMA is 355 KOHmg/g. A weight average molecular weight of the SMA is 7500.

A molar ratio of a styrene monomer and a maleic anhydride of "SMA EF30" is 3:1. An acid value of the SMA is 280 KOHmg/g. A weight average molecular weight of the SMA is 9500.

A molar ratio of a styrene monomer and a maleic anhydride of "SMA EF60" is 6:1. An acid value of the SMA is 215 KOHmg/g. A weight average molecular weight of the SMA is 11500.

Dicyanamide is used as an amine-based hardener. More specifically, "Dicy" manufactured by Nippon carbide Industries Co., Inc. is used.

(Hardening Accelerator)
2-ethyl-4-methylimidazole (2E4MZ) is used as the hardening accelerator.
(Inorganic Filler)
Crushed silica is used as the inorganic filler. More specifically, "MC3000" manufactured by Admatechs Co., Ltd. is used.
(Resin Composition)
In Examples 1 to 5 and Comparative Examples 1 to 5, the epoxy resin, the anhydride, and the hardening accelerator are blended with each other using blending amounts (parts by mass) shown in Table 1. The blended material is diluted using a solvent (MEK) so that the solid content (non-solvent component) concentration becomes from 60 mass % to 80 mass %, inclusive. By heating this while stirring this with a disper, a primary varnish containing a preliminary reaction product obtained by allowing a reaction between the epoxy resin and a part of the anhydride is prepared. As the heating conditions, the temperature is set to be from 60° C. to 80° C., inclusive, and the time is set to be 1 hour to 5 hours. The infrared absorption spectra before and after heating the primary varnish are measured to calculate the ring opening rate of the anhydride. As a result, the ring opening rate was equal to or greater than 80%. In addition, the SMA is blended with the primary varnish using the blending amount (parts by mass) shown in Table 1. The blended material is stirred and mixed for homogenization to prepare a base varnish.

In Example 6 and Comparative Examples 6 to 11, the epoxy resin, the hardener, and the hardening accelerator are blended with each other using blending amounts (parts by mass) shown in Table 1, without performing the preliminary reaction. The blended material is diluted using a solvent (MEK) so that the solid content (non-solvent component) concentration becomes from 60 mass % to 80 mass %, inclusive. The diluted material is stirred and mixed for homogenization at a temperature of 20° C. to 40° C. for a time of 1 hour to 3 hours, while stirring the diluted material with a disper. Accordingly, a base varnish is prepared.

Next, the inorganic filler is blended with the base varnish using the blending amount (parts by mass) shown in Table 1. The blended material is stirred and mixed for homogenization with a disper at a temperature of 20° C. to 40° C. for 2 hours, and accordingly, resin varnishes of Examples 1 to 6 and Comparative Examples 1 to 11 are prepared. The resin varnishes of Comparative Examples 1 and 2 were gelated and therefore, a prepreg which will be described later could not be manufactured.
(Prepreg)
A glass cloth which is a base material is impregnated with the resin varnish of the resin composition. This is heated and dried at a temperature of 110° C. to 140° C., inclusive, using a non-contact type heating unit. The solvent in the resin varnish is removed for semi-hardening of resin composition, and accordingly, a prepreg is manufactured. "1037-AS890AW" manufactured by Asahi Kasei Corporation is used as the glass cloth and the weight thereof is 23.5 g/m². A resin amount of the prepreg is 72 parts by mass (72 mass %) of the resin composition with respect to 100 parts by mass of the prepreg. When heating and drying the prepreg, the heating and drying is performed so that the gelation time of the prepreg is from 140 seconds to 160 seconds.
(Metal-Clad Laminated Plate)
The metal-clad laminated plate is manufactured as a copper-clad laminated plate. 16 sheets of prepregs (340 mm×510 mm) are laminated on each other to configure a laminate of the prepreg. Next, copper foils are laminated on both surfaces of this laminate in a thickness direction. By heating and pressurizing the laminate obtained by laminating the copper foil, a laminate-formed metal-clad laminated plate is manufactured. For the copper foil, "3EC-HI" manufactured by Mitsui Mining & Smelting Co., Ltd. is used and a thickness thereof is 18 μm. Conditions of heating and pressurizing are 180° C., 2.9 MPa, and 60 minutes. The adhesiveness between the prepreg and the copper foil of Comparative Example 10 is weaker than adhesiveness of other prepreg and copper foil and a metal-clad laminated plate for evaluation of performance could not be manufactured. This may be because the amount of the hardener is insufficient due to volatilization of the anhydride causes insufficient hardness.

(Peel Strength)

Peel strength of the copper foil on the surface of the copper-clad laminated plate is measured based on JIS C 6481. That is, the copper foil is peeled off at a speed of approximately 50 mm per minute, and the peel strength (kN/m) at this time is measured as the peel strength.

(Dielectric Constant (Dk))

A dielectric constant of the copper-clad laminated plate at 1 GHz is measured using "Impedance/Material Analyzer 4291A" manufactured by The Hewlett-Packard Company based on IPC-TM-650 2.5.5.9.

(Glass Transition Temperature (Tg))

A glass transition temperature of the prepreg is measured using a viscosity spectrometer "DMS6100" manufactured by Seiko Instruments Inc. Specifically, measurement is performed using a bending module by setting a frequency at 10 Hz, and a temperature at which tan α is obtained when the temperature has increased from room temperature to 280° C. at a rate of temperature rise of 5° C./min shows the maximum value is set as a glass transition temperature.

TABLE 1

| | | | Example 1 | Example 2 | Example 3 | Example 4 | Example 5 | Example 6 |
|---|---|---|---|---|---|---|---|---|
| presence or absence of preliminary reaction between epoxy resin and anhydride | | | presence | presence | presence | presence | presence | absence |
| ratio of anhydride equivalent number of anhydride with respect to epoxy equivalent number of epoxy resin | | | 0.20 | 0.20 | 0.46 | 0.11 | 0.44 | 0.46 |
| ratio of total number of anhydride equivalent number of anhydride and anhydride equivalent number of styrene-maleic anhydride copolymer with respect to epoxy equivalent number of epoxy resin | | | 1.00 | 1.00 | 1.00 | 0.53 | 1.15 | 1.00 |
| epoxy resin | | HP-7200H (DCPD type epoxy resin) | 69 | 64 | 63.7 | 77 | 60.5 | 63.7 |
| hardener | anhydride | RIKACID MH-700 (MeHHPA&HHPA) | 8 | 7.5 | 17 | 5 | 15.5 | 17 |
| | SMA | SMA 1000 (acid value: 480 KOHmg/g) | 23 | | | | | |
| | | SMA 2000 (acid value: 355 KOHmg/g) | | 28.5 | 19.3 | 18 | 24 | 19.3 |
| | | SMA EF30 (acid value: 280 KOHmg/g) | | | | | | |
| | | SMA EF60 (acid value: 215 KOHmg/g) | | | | | | |
| | dicyandiamide | Dicy | | | | | | |
| hardening accelerator | | 2E4MZ | 0.03 | 0.03 | 0.03 | 0.03 | 0.03 | 0.03 |
| | total (excluding inorganic filler) | | 100.0 | 100.0 | 100.0 | 100.0 | 100.0 | 100.0 |
| inorganic filler | crushed silica | MC3000 | 35 | 35 | 35 | 35 | 35 | 35 |
| | peel strength (kN/m) | | 0.86 | 0.84 | 0.88 | 0.82 | 0.82 | 0.84 |
| | Dk (material) | | 3.56 | 3.58 | 3.58 | 3.60 | 3.62 | 3.60 |
| | glass transition temperature (° C.) | | 146 | 143 | 145 | 142 | 141 | 142 |
| | resin amount of prepreg (%) | | 72 | 72 | 72 | 72 | 72 | 72 |
| | thickness of copper foil (3EC-III) (μm) | | 18 | 18 | 18 | 18 | 18 | 18 |

| | | | Comparative Example 1 | Comparative Example 2 | Comparative Example 3 | Comparative Example 4 | Comparative Example 5 | Comparative Example 6 |
|---|---|---|---|---|---|---|---|---|
| presence or absence of preliminary reaction between epoxy resin and anhydride | | | presence | presence | presence | presence | presence | absence |
| ratio of anhydride equivalent number of anhydride with respect to epoxy equivalent number of epoxy resin | | | 0.55 | 0.62 | 0.44 | 0.28 | 0.2 | 0.45 |
| ratio of total number of anhydride equivalent number of anhydride and anhydride equivalent number of styrene-maleic anhydride copolymer with respect to epoxy equivalent number of epoxy resin | | | 1.03 | 1.00 | 1.25 | 1.39 | 0.4 | 1.00 |
| epoxy resin | | HP-7200H (DCPD type epoxy resin) | 63 | 63.5 | 58.5 | 56 | 81.5 | 60.5 |
| hardener | anhydride | RIKACID MH-700 (MeHHPA&HHPA) | 20 | 23 | 15 | 9 | 9.5 | 16 |
| | SMA | SMA 1000 (acid value: 480 KOHmg/g) | | | | | | |

TABLE 1-continued

| | | | | | | | | |
|---|---|---|---|---|---|---|---|---|
| | | SMA 2000 (acid value: 355 KOHmg/g) | 17.0 | 13.5 | 26.5 | 35 | 9 | |
| | | SMA EF30 (acid value: 280 KOHmg/g) | | | | | | 23.5 |
| | | SMA EF60 (acid value: 215 KOHmg/g) | | | | | | |
| | dicyandiamide | Dicy | | | | | | |
| hardening accelerator | | 2E4MZ | 0.03 | 0.03 | 0.03 | 0.03 | 0.03 | 0.03 |
| | total (excluding inorganic filler) | | 100.0 | 100.0 | 100.0 | 100.0 | 100.0 | 100.0 |
| inorganic filler | crushed silica | MC3000 | 35 | 35 | 35 | 35 | 35 | 35 |
| | peel strength (kN/m) | | gelation in preliminary reaction (*1) | gelation in preliminary reaction (*1) | 0.81 | 0.81 | 0.65 | 0.77 |
| | Dk (material) | | | | 3.64 | 3.61 | 3.64 | 3.58 |
| | glass transition temperature (° C.) | | | | 139 | 139 | 138 | 138 |
| | resin amount of prepreg (%) | | | | 72 | 72 | 72 | 72 |
| | thickness of copper foil (3EC-III) (μm) | | | | 18 | 18 | 18 | 18 |

| | | | Comparative Example 7 | Comparative Example 8 | Comparative Example 9 | Comparative Example 10 | Comparative Example 11 |
|---|---|---|---|---|---|---|---|
| presence or absence of preliminary reaction between epoxy resin and anhydride | | | absence | absence | absence | absence | absence |
| ratio of anhydride equivalent number of anhydride with respect to epoxy equivalent number of epoxy resin | | | 0 | 0 | 0 | 1.00 | 0 |
| ratio of total number of anhydride equivalent number of anhydride and anhydride equivalent number of styrene-maleic anhydride copolymer with respect to epoxy equivalent number of epoxy resin | | | 0.39 | 1.00 | 0.85 | 1.00 | 0 |
| epoxy resin | HP-7200H (DCPD type epoxy resin) | | 82 | 58.5 | 48 | 63.5 | 96.4 |
| hardener | anhydride | RIKACID MH-700 (MeHHPA&HHPA) | | | | 36.5 | |
| | SMA | SMA 1000 (acid value: 480 KOHmg/g) | | | | | |
| | | SMA 2000 (acid value: 355 KOHmg/g) | 18 | | | | |
| | | SMA EF30 (acid value: 280 KOHmg/g) | | 41.5 | | | |
| | | SMA EF60 (acid value: 215 KOHmg/g) | | | 52 | | |
| | dicyandiamide | Dicy | | | | | 3.5 |
| hardening accelerator | | 2E4MZ | 0.03 | 0.03 | 0.03 | 0.03 | 0.09 |
| | total (excluding inorganic filler) | | 100.0 | 100.0 | 100.0 | 100.0 | 100.0 |
| inorganic filler | crushed silica | MC3000 | 35 | 35 | 35 | 35 | 35 |
| | peel strength (kN/m) | | 0.79 | 0.74 | 0.72 | laminated plate not manufacturable (*2) | 1.15 |
| | Dk (material) | | 3.64 | 3.61 | 3.61 | | 3.84 |
| | glass transition temperature (° C.) | | 139 | 140 | 140 | | 157 |
| | resin amount of prepreg (%) | | 72 | 72 | 72 | 72 | 72 |
| | thickness of copper foil (3EC-III) (μm) | | 18 | 18 | 18 | 18 | 18 |

(*1): since gelation is performed in a stage of a preliminary reaction between an epoxy resin and a monofunctional anhydride, a prepreg is not manufactured.
(*2): adhesive between prepregs and between a prepreg and copper foil is weak, and a metal-clad laminated plate for evaluation of performance could not be manufactured.

An amount of hardener was insufficient due to volatilization of a monofunctional anhydride and this caused insufficient hardness.

As shown in Table 1, it is confirmed that, in Examples 1 to 6, the dielectric constant is low, the peel strength is high, and each property is obtained with a good balance at an excellent level, compared to Comparative Examples 3 to 11.

In Comparative Examples 1 and 2, in which the ratio of the anhydride equivalent number of the anhydride with respect to the epoxy equivalent number of the epoxy resin in the preliminary reaction is greater than 0.5, the varnish is gelated and the prepreg could not be manufactured. Therefore, in the resin composition of the present disclosure, it is found that it is necessary that the ratio described above is smaller than 0.5.

The peel strength of Examples 1 to 6 in which the ratio of the total number of the anhydride equivalent number of the anhydride and the SMA with respect to the epoxy equivalent number of the epoxy resin is equal to or smaller than 1.2, is more excellent than the peel strength of Comparative Examples 3 and 4 in which the ratio is greater than 1.2. Therefore, in the resin composition of the present disclosure, it is found that it is necessary that the ratio is equal to or smaller than 1.2.

The peel strength of Examples 1 to 6 in which the ratio of the total number of the anhydride equivalent number of the anhydride and the SMA with respect to the epoxy equivalent number of the epoxy resin is equal to or greater than 0.5, is more excellent than the peel strength of Comparative Example 5 in which the ratio is smaller than 0.5. Therefore, particularly, in the resin composition of the present disclosure, it is found that it is necessary that the ratio is equal to or greater than 0.5.

The peel strength of Examples 1 to 6 in which the acid value of the SMA is equal to or greater than 300 KOH/mg/g is more excellent than the peel strength of Comparative Example 6 in which the acid value of the SMA is smaller than 300 KOHmg/g. Therefore, in the resin composition of the present disclosure, it is found that it is necessary that the acid value of the SMA is equal to or greater than 300 KOHmg/g.

The peel strength of Examples 1 to 6 in which the ratio of the anhydride equivalent number of the anhydride with respect to the epoxy equivalent number of the epoxy resin is equal to or greater than 0.05 is excellent, compared to the peel strength and the dielectric constant of Comparative Example 8 in which the ratio is smaller than 0.05. Therefore, in the resin composition of the present disclosure, it is found that it is necessary that the ratio is equal to or greater than 0.05.

The dielectric constant of Examples 1 to 6 in which the anhydride containing only one anhydride group and the SMA are contained is significantly excellent, compared to the dielectric constant of Comparative Example 11 in which dicyandiamide is used as the hardener. Therefore, in the resin composition of the present disclosure, it is found that it is necessary that the anhydride containing only one anhydride group and the SMA are contained.

What is claimed is:

1. A resin composition comprising:
an epoxy resin; and
a hardener,
wherein the hardener contains a styrene-maleic anhydride copolymer and an anhydride having only one anhydride group in a molecule,
an acid value of the styrene-maleic anhydride copolymer is in a range from 300 to 550, inclusive,
a ratio of an anhydride group equivalent number of the anhydride with respect to an epoxy group equivalent number of the epoxy resin is in a range from 0.05 to 0.5, inclusive, and
a ratio of a total number of an anhydride group equivalent number of the anhydride and an anhydride group equivalent number of the styrene-maleic anhydride copolymer with respect to the epoxy group equivalent number is in a range from 0.5 to 1.2, inclusive.

2. The resin composition of claim 1, further comprising:
a preliminary reaction product obtained by a reaction between the anhydride and the epoxy resin.

3. The resin composition of claim 1,
wherein the epoxy resin contains a dicyclopentadiene type epoxy resin.

4. A prepreg comprising:
the resin composition of claim 1; and
a base material impregnated with the resin composition.

5. A metal foil with resin, comprising:
a metal layer; and
an insulating layer provided on the metal layer,
wherein the insulating layer contains an unhardened product of the resin composition of claim 1.

6. A metal-clad laminated plate comprising:
an insulating layer containing a hardened product of the resin composition of claim 1; and
a metal layer provided on the insulating layer.

7. A printed wiring board comprising:
an insulating layer containing a hardened product of the resin composition of claim 1; and
a wiring provided on the insulating layer.

* * * * *